(12) United States Patent
Rahman et al.

(10) Patent No.: US 10,122,101 B2
(45) Date of Patent: Nov. 6, 2018

(54) MOTORIZED HOT STICK SYSTEM FOR CLAMPING GROUNDING DEVICES ON OVERHEAD LINES

(71) Applicant: Honeywell International Inc., Morris Plains, NJ (US)

(72) Inventors: Ataur Rahman, Hyderabad (IN); Ravi kumar Avupati, Hyderabad (IN); Srinivasarao Bommana, Hyderabad (IN); Mehabube Rabbanee Shaik, Hyderabad (IN); Linda Ziegler-Robinson, Goose Creek, SC (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/790,795

(22) Filed: Oct. 23, 2017

(65) Prior Publication Data

US 2018/0115090 A1  Apr. 26, 2018

(51) Int. Cl.
| | | |
|---|---|---|
| *H01R 11/15* | (2006.01) |
| *H01R 4/38* | (2006.01) |
| *H02G 1/02* | (2006.01) |
| *H01R 4/64* | (2006.01) |
| *H02P 8/12* | (2006.01) |
| *H02P 6/28* | (2016.01) |

(Continued)

(52) U.S. Cl.
CPC ............... *H01R 11/15* (2013.01); *H01R 4/38* (2013.01); *H01R 4/643* (2013.01); *H02G 1/02* (2013.01); *H02P 6/28* (2016.02); *H02P 8/12* (2013.01); *G01R 1/20* (2013.01); *G01R 19/0092* (2013.01); *H02P 8/14* (2013.01)

(58) Field of Classification Search
CPC ........ H01R 11/14; H01R 43/00; H01R 43/26; H02G 1/02
See application file for complete search history.

(56) References Cited

U.S. PATENT DOCUMENTS

| | | | | |
|---|---|---|---|---|
| 3,017,905 A | * | 1/1962 | Klein ................. | H01R 43/0427 140/113 |
| 4,326,316 A | * | 4/1982 | Dolenti .................. | A46B 13/02 15/23 |

(Continued)

FOREIGN PATENT DOCUMENTS

JP         07222318 A   *   8/1995

*Primary Examiner* — Briggitte R Hammond
(74) *Attorney, Agent, or Firm* — Wood, Phillips, Katz, Clark & Mortimer

(57) ABSTRACT

A hot stick 8 is provided for applying a grounding clamp, such as a grounding clamp 10, to an overhead electrical conductor, such as an overhead electrical conductor 12. The hot stick 8 includes an elongate insulating pole 42, an electric stepper motor 44 carried on the pole 42, and an adapter 46 mounted on the pole 42 for rotation about an axis 22, with the adapter 46 operably connected to the electric motor 44 to be rotated by the electric motor 44 about the axis 22. The adapter 46 has a receptacle 52 configured to receive a rotatable member 20 of a grounding clamp, such as a rotatable member 20 of the grounding clamp 10, and to transfer a rotational force from the electric motor 44 to the rotatable member 20 to actuate the grounding clamp 10 between an open condition and clamped condition of the grounding clamp 10.

20 Claims, 3 Drawing Sheets

(51) Int. Cl.
  *H02P 8/14* (2006.01)
  *G01R 1/20* (2006.01)
  *G01R 19/00* (2006.01)

(56) References Cited

U.S. PATENT DOCUMENTS

| | | | | |
|---|---|---|---|---|
| 4,794,328 | A * | 12/1988 | Fernandes | G01K 1/024 29/240 |
| 5,299,464 | A * | 4/1994 | Bennett | G01N 33/28 137/315.41 |
| 5,742,220 | A * | 4/1998 | Scherer | H01H 85/0208 294/174 |
| 7,834,487 | B2 * | 11/2010 | Netz | H02G 1/02 307/326 |
| 8,056,445 | B2 * | 11/2011 | Jackson, III | B25B 13/5091 81/487 |
| 9,768,576 | B2 * | 9/2017 | Sook | H01R 43/26 |
| 9,881,755 | B1 * | 1/2018 | Cleaveland | H02S 40/38 |
| 2015/0270674 | A1 * | 9/2015 | Sook | H01R 43/26 414/732 |
| 2018/0114654 | A1 * | 4/2018 | Cleaveland | H01H 9/54 |
| 2018/0115090 | A1 * | 4/2018 | Rahman | H01R 11/15 |

* cited by examiner

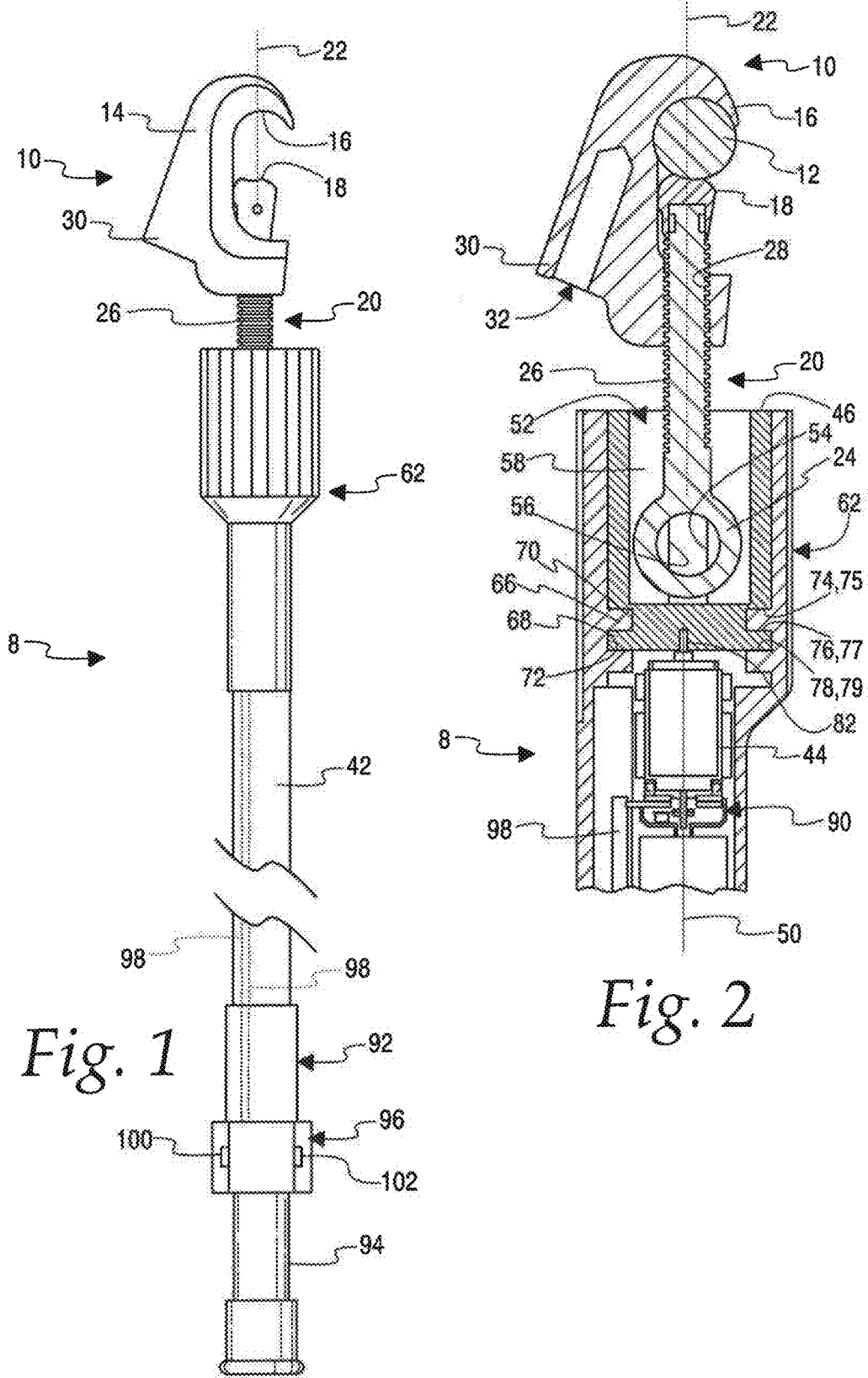

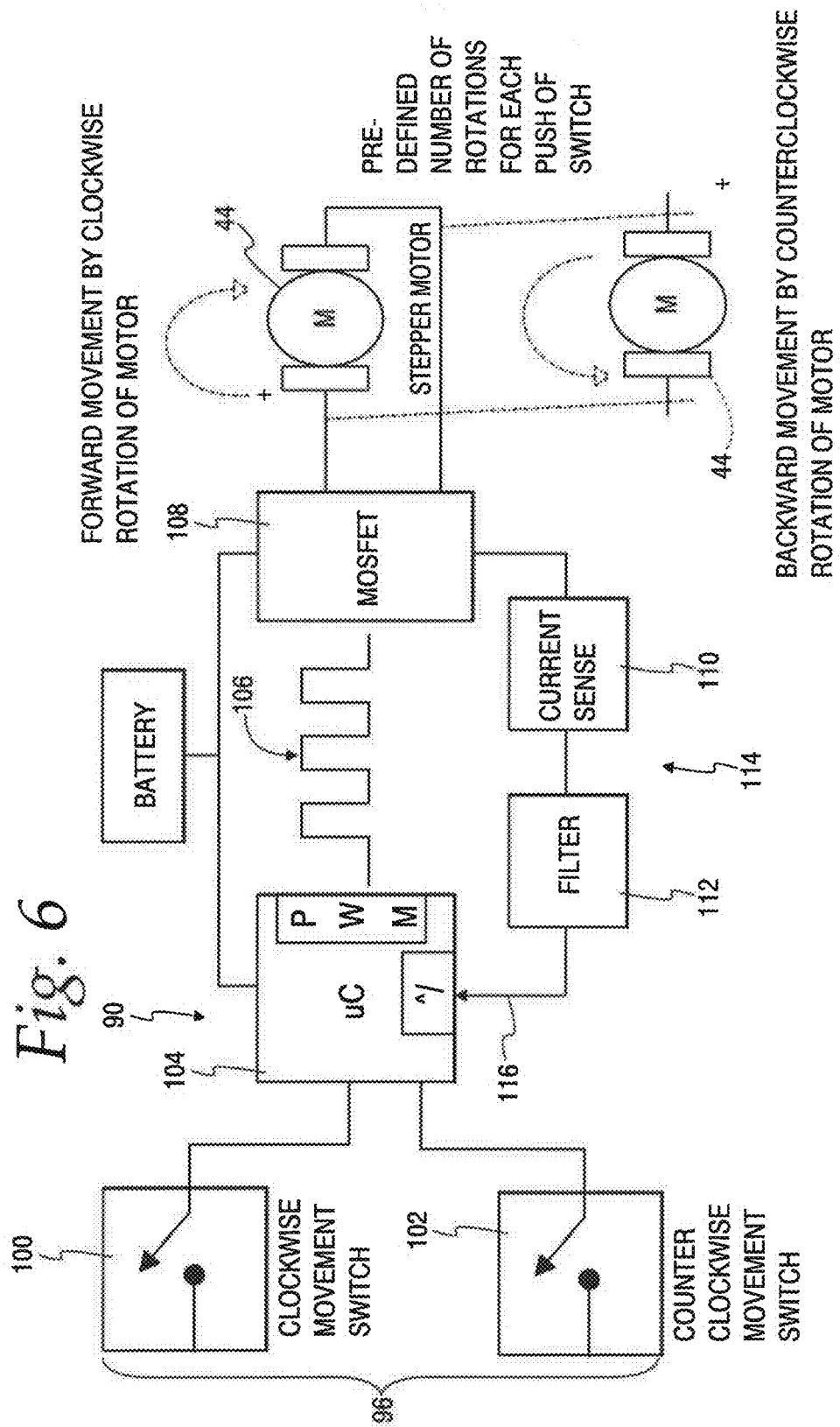

MOTORIZED HOT STICK SYSTEM FOR CLAMPING GROUNDING DEVICES ON OVERHEAD LINES

CROSS-REFERENCE TO RELATED APPLICATIONS

This is a non-provisional application claiming priority to Indian Provisional Appln. No. 201611036348, filed on Oct. 24, 2016, which is hereby incorporated by reference in its entirety.

FEDERALLY SPONSORED RESEARCH OR DEVELOPMENT

Not Applicable.

MICROFICHE/COPYRIGHT REFERENCE

Not Applicable.

FIELD

This disclosure is directed toward hot sticks for operating grounding clamps such as are used by electric linemen and other workers to provide a grounded connection to an overhead electrical conductor, such as an overhead electrical power line and the like, wherein the grounding clamp is operated via an elongate stick or pole ("hot stick").

BACKGROUND

Electrical linemen use grounding clamps in their daily work. The linemen use an elongate stick or pole, referred to herein as a "hot stick", to grab an overhead electrical conductor, typically an electric wire, post or ball stud, with the clamp. Once the overhead electrical conductor is engaged, the lineman then tightens the clamp onto the overhead electrical conductor by rotating the stick while holding the clamp on the overhead electrical conductor. This process is time consuming and difficult for the lineman who is operating the stick overhead either from the ground or an elevated bucket. For each operation of a conventional grounding clamp, the number of screw rotations undertaken are at least 15. The lineman operates many such grounding clamps at a stretch in the field and, at end of the exercise, can become very exhausted.

SUMMARY

In accordance with one feature of this disclosure, a hot stick is provided for applying a grounding clamp to an overhead electrical conductor. The grounding clamp includes a rotatable member to actuate the grounding clamp between an open condition wherein an overhead electrical conductor can be inserted into the grounding clamp and a clamped condition wherein an overhead electrical conductor is clamped in the grounding clamp to provide an electrically conductive connection between the grounding clamp and the overhead electrical connection. The hot stick includes an elongate electrical insulating pole, an electric motor carried on the pole, and an adapter mounted on the pole for rotation about an axis and operably connected to the electric motor. The adapter has a receptacle configured to receive a rotatable member of a grounding clamp and to transfer a rotational force from the electric motor to the rotatable member to actuate the grounding clamp between an open condition and a clamped condition.

As one feature, the receptacle is configured to allow a rotatable member of a grounding clamp to translate along the axis as the adapter transfers a rotational force from the electric motor to the rotatable member.

In one feature, the receptacle includes a pair of spaced surfaces extending parallel to the axis. According to a further feature, the receptacle includes an additional pair of spaced surfaces extending parallel to the axis. As yet a further feature, the receptacle has a cross shaped transverse cross section defined by the pairs of spaced surfaces.

In one feature, an adapter housing is carried on the end of the pole, the adapter mounted for rotation about the axis in the adapter housing.

According to one feature, the hot stick further includes an axial bearing between the adapter and the adapter housing to react axial loads placed on the adapter.

As one feature, the axial bearing includes mating annular surfaces on the adapter and the adapter housing centered on the axis and extending transverse to the axis, the annular surfaces abutted against each other to react axial loads placed on the adapter.

In one feature, the axial bearing includes an annular groove on one of the adapter and the adapter housing and an annular rib on the other of the adapter and the adapter housing, and wherein the rib extends in to the groove.

According to one feature, the motor is mounted in the adapter housing.

As one feature, the motor includes a drive shaft extending along the axis, the drive shaft engaged with the adapter.

In one feature, a motor controller is carried on the pole operably connected to the electric motor to control the motor.

According to one feature, a user operated manual switch is carried on the pole and operably connected to the motor control.

As one feature, the motor controller is configured to selectively rotate the motor clockwise and counterclockwise in response to user inputs to the switch.

In one feature, the motor controller is configured to rotate the motor a predetermined number of revolutions in response to a user input to the switch.

According to one feature, the motor controller includes a current sensor to provide a signal representative of a current draw by the motor, and wherein the motor controller stops movement of the motor in response to the signal indicating a predetermined current draw.

As one feature, a method of connecting a grounding clamp to an overhead electrical conductor is provided. The method includes the steps of: engaging a rotatable member of a grounding clamp in an adapter carried on the end of a hot stick, inserting an overhead electrical conductor into the grounding clamp with the grounding clamp in an open condition and the rotatable member engaged in the adapter, operating a motor carried on the hot stick to rotate the adapter and the rotatable member together to actuate the grounding clamp from the open condition to a clamped condition wherein an electrically conductive connection is created between the grounding clamp and the overhead electrical conductor and the grounding clamp is clamped to the overhead electrical conductor, and disengaging the rotatable member from the adapter while leaving the grounding clamp clamped to the overhead electrical conductor.

In one feature, the step of operating a motor further includes stopping the rotation of the motor in response to a sensed current draw by the motor.

According to one feature, a method of disconnecting a grounding clamp to an overhead electrical conductor is provided. The method includes the steps of: engaging a rotatable member of a grounding clamp in an adapter carried on the end of a hot stick while the grounding clamp is in a clamped condition wherein the grounding clamp is clamped to the overhead electrical conductor to provide an electrically conductive connection between the grounding clamp and the overhead electrical conductor, operating a motor carried on the hot stick to rotate the adapter and the rotatable member together to actuate the grounding clamp from the clamped condition to an open condition wherein the grounding clamp and the overhead electrical conductor can be disengaged, and disengaging the overhead electrical conductor and the grounding clamp.

As one feature, the step of operating a motor further includes stopping the rotation of the motor in response to a sensed current draw by the motor.

It should be understood that this disclosure contemplates a hot stick and method with any combination of the above features.

Other features and advantages will become apparent from a review of the entire specification, including the appended claims and drawings.

BRIEF DESCRIPTION OF THE DRAWINGS

FIG. 1 is a somewhat diagrammatic, isometric view of a grounding clamp and hot stick according to this disclosure shown in an open position/condition;

FIG. 2 is an enlarged, somewhat diagrammatic partial cross section of an upper portion of the hot stick and grounding clamp of FIG. 1 showing a rotatable member of the grounding clamp inserted into a rotatable adapter component of the hot stick, with the grounding clamp in a closed position/condition to provide an electrically conductive connection between the grounding clamp and an overhead electrical conductor clamped therein;

FIG. 6 is a block diagram illustrating a motor, a motor control, and a user operated, manual switch of the hot stick of FIGS. 1-5.

DETAILED DESCRIPTION

Figure 3:
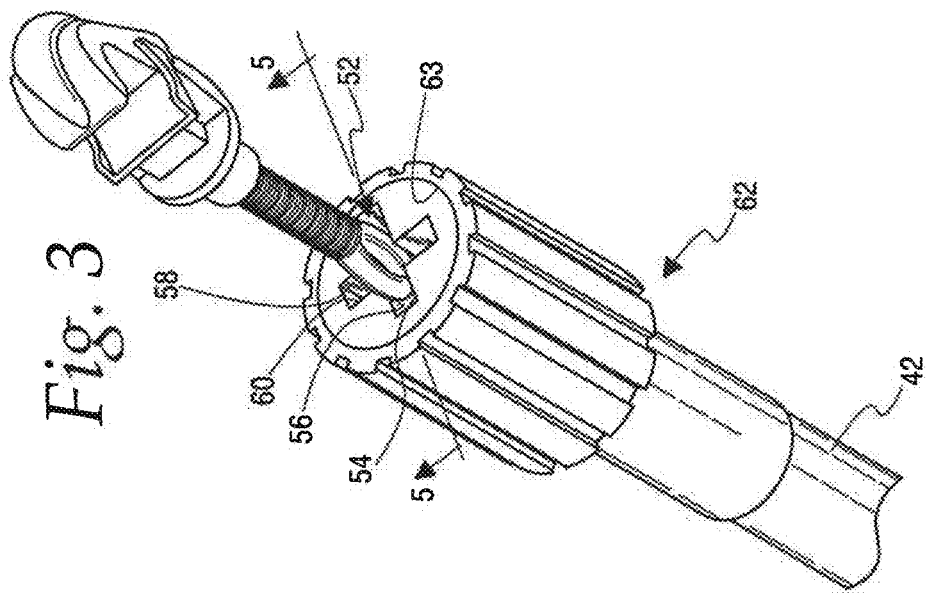
FIG. 3 is an isometric view from above showing the grounding clamp of FIG. 1 being inserted into the adapter component of the hot stick of FIGS. 1 and 2.

A hot stick 8 is described herein that can solve the fatigue problem discussed in the Background section, can allow for a grounding clamp to be quickly installed and/or removed, and can ease the difficulties faced during grounding clamp installation and/or removal by removing the necessity to manually rotate the screw of a conventional grounding clamp numerous times before it is tightened. It also improves lineman productivity, especially when a lineman has multitude of such clamps to deal with at a stretch.

With reference to FIGS. 1 and 2, a commercially available grounding clamp 10 is shown as an example for use with the hot stick 8 for application to an overhead electrical conductor 12 (shown in FIG. 2), with the grounding clamp 10 being of the type that is conventionally actuated by a user operated "shotgun stick" (not shown). The grounding clamp 10 includes a body 14 that is connectable to the electrical conductor 12 to provide an electrically conductive connection with the grounding clamp 10 in a clamped condition such as is shown in FIG. 2. First and second jaws 16 and 18 extending from the body 14 and are movable relative to each other between an open position (open condition of the grounding clamp 10 shown in FIG. 1) wherein the overhead electrical conductor 12 may be inserted into the grounding clamp 10 and a closed position (clamped condition of the grounding clamp 10 shown in FIG. 2) wherein the overhead electrical conductor 12 can be clamped between the jaws 16 and 18 to provide an electrically conductive connection between the grounding clamp 10 and the overhead electrical conductor 12. To accomplish this movement of the jaws, the clamp 10 includes a rotatable member 20 mounted for rotation about an axis 22. The rotatable member 20 includes a torque connector 24 illustrated in the form of a torque ring or eyelet 24, such as is well known in the industry conventionally for engagement with the user operated shotgun stick and transferring a rotational torque applied by the shotgun stick to the rotatable member 20 to thereby actuate the jaws 16 and 18 between the open and closed positions. In this regard, the rotatable member 20 includes external screw threads 26 that are engaged with mating internal screw threads 28 in the body 14 such that the rotatable member 20 translates along the axis 22 in response to the engagement of the screw threads 26 and 28 as the rotatable member 20 is rotated about the axis 22. In the illustrated embodiment, the jaw 16 is fixed on, and indeed is a unitary part, of the body 14 and the jaw 18 is translatable relative to the body 14 along the axis 22. In this regard, the jaw 18 includes anti-rotation feature that also guides the jaw 18 for translation along the axis 32 relative to the body 14. The body 14 includes a boss 30 having a bore 32 that is configured to receive an end of an electrical conduit to form an electrical conductive ground connection with the electrical conduit (not shown).

It should be understood that although the hot stick 8 is shown and described herein in connection with one particular type of commercially available grounding clamp 10 and type of clamp jaws 16, 18, the disclosed hot stick 8 can be utilized with other types of grounding clamps, including C-clamps and duck bill clamps and clamps for ball studs, and grounding clamps having other types of rotatable members for actuating the grounding clamp between open and closed conditions. Accordingly, the hot stick concept disclosed herein is not intended to be limited in any way to any particular type of grounding clamp, unless expressly recited in an appended claim.

As best seen in FIGS. 1 and 2, the hot stick 8 is provided for applying a grounding clamp, such as the grounding clamp 10, to an overhead electrical conductor, such as the overhead electrical conductor 12. The hot stick 8 includes an elongate insulating pole 42, an electric stepper motor 44 carried on the pole 42, and an adapter 46 mounted on the pole 42 for rotation about an axis 50, with the adapter 46 operably connected to the electric motor 44 to be rotated by the electric motor 44 about the axis 22. In this regard, in the illustrated embodiment, axis 50 is coaxial with axis 22. The adapter 46 has a receptacle 52 configured to receive a rotatable member of a grounding clamp, such as the rotatable member 20 of the grounding clamp 10, and to transfer a rotational force from the electric motor 44 to the rotatable member 20 to actuate the grounding clamp 10 between an open condition and clamped condition of the grounding clamp 10. The receptacle 52 is configured to allow the rotatable member 20 of the grounding clamp 10 to translate along the axis 22 as the adapter 46 transfers the rotational force from the electric motor 44 to the rotatable member 20. In this regard, with respect to an adapter 46 for use with the illustrated grounding clamp 10, the receptacle 52 includes a pair of spaced surfaces 54 and 56 extending parallel to the axis 22 with the surfaces 54 and 56 being spaced by a distance sufficient to receive the eyelet 24 of the rotatable member 20. In the illustrated embodiment, the receptacle 52 further includes an additional pair of spaced surfaces 58 and 60 extending parallel to the axis 22 such that the receptacle 52 has a cross-shaped or X-shaped transverse cross section defined by the pairs of spaced surfaces 54-60. This allows more options for the rotatable member 20 to be inserted into the receptacle 52. It should be appreciated that while the illustrated embodiment of the receptacle 52 will be desirable in many applications, the receptacle 52 may take other shapes in order to accommodate a different type of rotatable member depending upon the particular configuration of grounding clamp that will be utilized with the hot stick 8 so that the particular form of rotatable member can be rotated and translated as discussed above in connection with the rotatable member 20. Accordingly, no limitation to a particular geometric configuration or form of the receptacle 52 is intended unless expressly recited in the claim appended hereto.

The hot stick 8 further includes an adapter housing 62 carried on the end of the pole, with the adapter 46 mounted in the housing 62 for rotation about the axis 50. In this regard, the adapter housing 62 includes a cylindrical-shaped bore 63 that conforms to the cylindrical outer surface of the adapter 46. Further in this regard, an axial bearing, shown generally at 64, is provided between the adapter 46 and the adapter housing 62 to react axial loads placed on the adapter 46. In the illustrated embodiment, the axial bearing 64 is provided by mating annular ribs 66,68 and grooves 70,72 provided on the adapter 46 and the adapter housing 62, with annular ribs 66 and 68 extending into the annular grooves 70 and 72. The ribs 66 and 68 and the grooves 70 and 72 define mating annular surfaces 74, 75, 76, 77, 78 and 79, with the surfaces centered on the axis 22 and extending transverse of the axis 22. Each pair of the annular surfaces 74-79 can be abutted against each other to react axial loads placed on the adapter 46. It should be appreciated that while the disclosed structure for the axial bearing 64 will be advantageous in many applications, in some applications it may be desirable to utilize other suitable forms for the axial bearing 64. Accordingly, no limitation is intended to the specific form of axial bearing 64 illustrated herein unless expressly recited in an appended claim.

Figure 4:
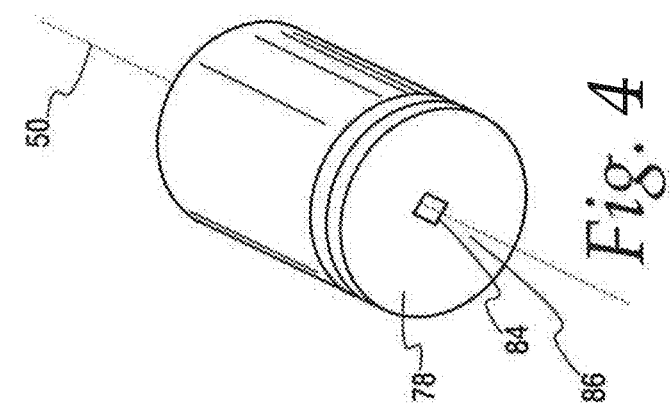
FIG. 4 is an isometric view from below of the adapter component shown in FIGS. 2 and 3.
Figure 5:
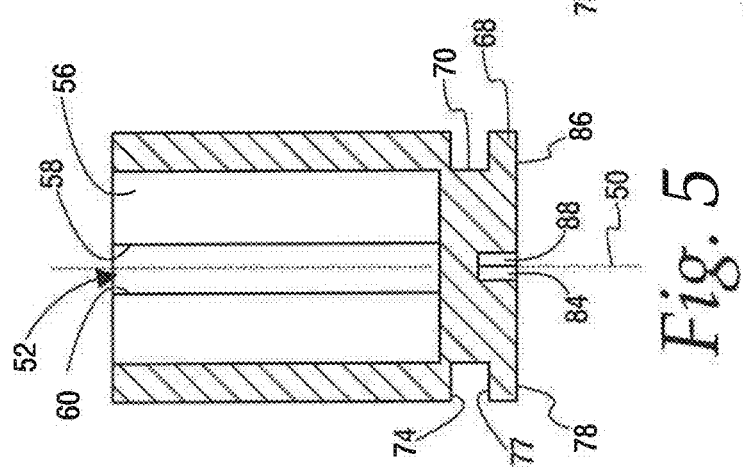
FIG. 5 is an enlarged cross-sectional view of the adapter of FIGS. 3 and 4 taken along line 5-5 in FIG. 3.

In the illustrated embodiment, the motor 44 is mounted in the adapter housing 62 and includes a drive shaft 82 extending along the axis 50 and the axis 22 into engagement with the adapter 46. In this regard, the adapter 46 includes a drive receptacle 84 (best seen in FIGS. 4 and 5) in a downwardly facing surface 86 of the adapter 46 that receives the drive shaft 82, with the drive shaft 82 and the receptacle 84 having any suitable mating features, such as flats 88, that will transfer the torque from the motor 44 to the adapter 46.

A motor controller 90 is also mounted in the adapter housing 62 and positioned beneath the motor 44 to control the motor 44. A hand grip 92 is provided at a lower end 94 of the hot stick 8 and includes a manual switch 96 operably connected to the motor controller 90 via suitable electrical conductors or wires 98 that extend from the switch 96 to the motor 44. A battery 98 (shown in FIG. 6) can also be positioned as desired within the pole 42 and connected to the switch 96, motor controller 90 and the motor 44 via the electrical wires 98.

The motor controller 90 is configured to selectively rotate the motor 44 either clockwise or counterclockwise in response to user inputs to the switch 96. In the illustrated embodiment, the switch 96 includes a clockwise rotation switch 100 and a counterclockwise rotation switch 102. As best seen in FIG. 6, the controller 90 includes a microcontroller 104 that provides a pulse width modulated signal 106 to a metal-oxide-semiconductor field-effect transistor 108 which controls the current to the stepper motor 44 based upon the signal 106. In this regard, in the illustrated embodiment, the controller 90 and microcontroller 104 are configured to rotate the motor 44 and drive shaft 82 by a predefined number of rotations for each push of either switch 100 or 102. A current sensor 110 and filter 112 are also provided in the motor controller 90 in a feedback loop 114 to the microcontroller 104 to provide a signal 116 representative of a current draw by the motor 44. The microcontroller 104 is configured to stop movement of the motor 44 in response to the signal 116 indicating that motor 44 has experienced a predetermined current draw, which predetermined current draw is based upon a max desired torque output from the motor 44. This torque limitation on the motor 44 allows for a consistent closing force of the grounding clamp jaws on the overhead electrical conductor 12, with a user only needing to press the switch 100 until the motor stops rotating in response to the signal 116. Similarly, the signal 116 limits the amount of torque applied to the motor when the grounding clamp is being moved to the open condition so that the equipment is not over torqued when the grounding clamp is fully opened.

It should be appreciated that while specific forms and geometries have been shown herein for the components of the specific embodiments of the hot stick 10 in the illustrations, this disclosure contemplates that other forms and geometries may be utilized with the concepts disclosed herein and that the concepts disclosed herein can find use and be incorporated in any type of grounding clamp for use with overhead electrical conductors.

The following are examples, although not exhaustive, of the subject matter that can be claimed in connection with this disclosure.

1. A hot stick 8 for applying a grounding clamp 10 to an overhead electrical conductor 12, the grounding clamp 10 including a rotatable member 20 to actuate the grounding clamp 10 between an open condition wherein an overhead electrical conductor 12 can be inserted into the grounding clamp 10 and a clamped condition wherein an overhead electrical conductor 12 is clamped in the grounding clamp 10 to provide an electrically conductive connection between the grounding clamp 10 and the overhead electrical connection, the hot stick 8 comprising:

an elongate electrical insulating pole 42;
an electric motor 44 carried on the pole 42; and
an adapter 46 mounted on the pole 42 for rotation about an axis 22 and operably connected to the electric motor 44, the adapter 46 having a receptacle 52 configured to receive a rotatable member 20 of a grounding clamp 10 and to transfer a rotational force from the electric motor 44 to the rotatable member 20 to actuate the grounding clamp 10 between an open condition and a clamped condition.

2. The hot stick 8 of claim 1 wherein the receptacle 52 is configured to allow a rotatable member 20 of a grounding clamp 10 to translate along the axis 22 as the adapter 46 transfers a rotational force from the electric motor 44 to the rotatable member 20.

3. The hot stick 8 of claim 2 wherein the receptacle 52 comprises a pair of spaced surfaces 54 and 56 extending parallel to the axis 22.

4. The hot stick 8 of claim 3 wherein the receptacle 52 comprises an additional pair of spaced surfaces 58 and 60 extending parallel to the axis 22.

5. The hot stick 8 of claim 4 wherein the receptacle 52 has a cross shaped transverse cross section defined by the pairs of spaced surfaces 54-60.

6. The hot stick 8 of any preceding claim further comprising an adapter housing 62 carried on the pole 42, the adapter 46 mounted for rotation about the axis 22 in the adapter housing 62.

7. The hot stick 8 of claim 6 further comprising an axial bearing 64 between the adapter 46 and the adapter housing 62 to react axial loads placed on the adapter 46.

8. The hot stick 8 of claim 7 wherein the axial bearing 64 comprises mating annular surfaces 74-79 on the adapter 46 and the adapter housing 62 centered on the axis 22 and extending transverse to the axis 22, the annular surfaces 74, 76, 78 or 80 abutted against each other to react axial loads placed on the adapter 46.

9. The hot stick 8 of claim 7 wherein the axial bearing 64 comprises an annular groove 70 or 72 on one of the adapter 46 and the adapter housing 62 and an annular rib 66 or 68 on the other of the adapter 46 and the adapter housing 62, and wherein the rib 66 or 69 extends into the groove 70 or 72.

10. The hot stick 8 of claim 6 wherein the motor 44 is mounted in the adapter housing 62.

11. The hot stick 8 of claim 10 wherein the motor 44 comprises a drive shaft 82 extending along the axis 22, the drive shaft 82 engaged with the adapter 46.

12. The hot stick 8 of any preceding claim further comprising a motor controller 90 carried on the pole 42 operably connected to the electric motor 44 to control the motor 44.

13. The hot stick 8 of claim 12 further comprising a user operated manual switch 96 carried on the pole 42 and operably connected to the motor 44 control.

14. The hot stick 8 of claim 13 wherein the motor 44 controller is configured to selectively rotate the motor 44 clockwise and counterclockwise in response to user inputs to the switch 96.

15. The hot stick 8 of claim 14 wherein the motor controller 90 is configured to rotate the motor 44 a predetermined number of revolutions in response to a user input to the switch 96.

16. The hot stick 8 of any of claims 12-15 wherein the motor controller 90 comprises a current sensor 110 to provide a signal 116 representative of a current draw by the motor 44, and wherein the motor controller 90 stops movement of the motor 44 in response to the signal 116 indicating a predetermined current draw.

17. A method of connecting a grounding clamp 10 to an overhead electrical conductor 12, the method comprising the steps of:
engaging a rotatable member 20 of a grounding clamp 10 in an adapter 46 carried on the end 48 of a hot stick 8;
inserting an overhead electrical conductor 12 into the grounding clamp 10 with the grounding clamp 10 in an open condition and the rotatable member 20 engaged in the adapter 46;

operating a motor 44 carried on the hot stick 8 to rotate the adapter 46 and the rotatable member 20 together to actuate the grounding clamp 10 from the open condition to a clamped condition wherein an electrically conductive connection is created between the grounding clamp 10 and the overhead electrical conductor 12 and the grounding clamp 10 is clamped to the overhead electrical conductor 12; and
disengaging the rotatable member 20 from the adapter 46 while leaving the grounding clamp 10 clamped to the overhead electrical conductor 12.

18. The method of claim 17 wherein the step of operating a motor 44 further comprises stopping the rotation of the motor 44 in response to a sensed current draw by the motor 44.

19. A method of disconnecting a grounding clamp 10 to an overhead electrical conductor 12, the method comprising the steps of:
engaging a rotatable member 20 of a grounding clamp 10 in an adapter 46 carried on the end 48 of a hot stick 8 while the grounding clamp 10 is in a clamped condition wherein the grounding clamp 10 is clamped to the overhead electrical conductor 12 to provide an electrically conductive connection between the grounding clamp 10 and the overhead electrical conductor 12;
operating a motor 44 carried on the hot stick 8 to rotate the adapter 46 and the rotatable member 20 together to actuate the grounding clamp 10 from the clamped condition to an open condition wherein the grounding clamp 10 and the overhead electrical conductor 12 can be disengaged; and
disengaging the overhead electrical conductor 12 and the grounding clamp 10.

20. The method of claim 19 wherein the step of operating a motor 44 further comprises stopping the rotation of the motor 44 in response to a sensed current draw by the motor 44.

The invention claimed is:

1. A hot stick for applying a grounding clamp to an overhead electrical conductor, the grounding clamp including a rotatable member to actuate the grounding clamp between an open condition wherein an overhead electrical conductor can be inserted into the grounding clamp and a clamped condition wherein an overhead electrical conductor is clamped in the grounding clamp to provide an electrically conductive connection between the grounding clamp and the overhead electrical connection, the hot stick comprising:
an elongate electrical insulating pole;
an electric motor carried on the pole; and
an adapter mounted on the pole for rotation about an axis and operably connected to the electric motor, the adapter having a receptacle configured to receive a rotatable member of a grounding clamp and to transfer a rotational force from the electric motor to the rotatable member to actuate the grounding clamp between an open condition and a clamped condition.

2. The hot stick of claim 1 wherein the receptacle is configured to allow a rotatable member of a grounding clamp to translate along the axis as the adapter transfers a rotational force from the electric motor to the rotatable member.

3. The hot stick of claim 2 wherein the receptacle comprises a pair of spaced surfaces extending parallel to the axis.

4. The hot stick of claim 3 wherein the receptacle comprises an additional pair of spaced surfaces extending parallel to the axis.

5. The hot stick of claim 4 wherein the receptacle has a cross shaped transverse cross section defined by the pairs of spaced surfaces.

6. The hot stick of claim 1 further comprising an adapter housing carried on the pole, the adapter mounted for rotation about the axis in the adapter housing.

7. The hot stick of claim 6 further comprising an axial bearing between the adapter and the adapter housing to react axial loads placed on the adapter.

8. The hot stick of claim 7 wherein the axial bearing comprises mating annular surfaces on the adapter and the adapter housing centered on the axis and extending transverse to the axis, the annular surfaces abutted against each other to react axial loads placed on the adapter.

9. The hot stick of claim 7 wherein the axial bearing comprises an annular groove on one of the adapter and the adapter housing and an annular rib on the other of the adapter and the adapter housing, and wherein the rib extends into the groove.

10. The hot stick of claim 6 wherein the motor is mounted in the adapter housing.

11. The hot stick of claim 10 wherein the motor comprises a drive shaft extending along the axis, the drive shaft engaged with the adapter.

12. The hot stick of claim 1 further comprising a motor controller carried on the pole operably connected to the electric motor to control the motor.

13. The hot stick of claim 12 further comprising a user operated manual switch carried on the pole and operably connected to the motor control.

14. The hot stick of claim 13 wherein the motor controller is configured to selectively rotate the motor clockwise and counterclockwise in response to user inputs to the switch.

15. The hot stick of claim 14 wherein the motor controller is configured to rotate the motor a predetermined number of revolutions in response to a user input to the switch.

16. The hot stick of claim 12 wherein the motor controller comprises a current sensor to provide a signal representative of a current draw by the motor, and wherein the motor controller stops movement of the motor in response to the signal indicating a predetermined current draw.

17. A method of connecting a grounding clamp to an overhead electrical conductor, the method comprising the steps of:

engaging a rotatable member of a grounding clamp in an adapter carried on the end of a hot stick;

inserting an overhead electrical conductor into the grounding clamp with the grounding clamp in an open condition and the rotatable member engaged in the adapter;

operating a motor carried on the hot stick to rotate the adapter and the rotatable member together to actuate the grounding clamp from the open condition to a clamped condition wherein an electrically conductive connection is created between the grounding clamp and the overhead electrical conductor and the grounding clamp is clamped to the overhead electrical conductor; and disengaging the rotatable member from the adapter while leaving the grounding clamp clamped to the overhead electrical conductor.

18. The method of claim 17 wherein the step of operating a motor further comprises stopping the rotation of the motor in response to a sensed current draw by the motor.

19. A method of disconnecting a grounding clamp to an overhead electrical conductor, the method comprising the steps of;

engaging a rotatable member of a grounding clamp in an adapter carried on the end of a hot stick while the grounding clamp is in a clamped condition wherein the grounding clamp is clamped to the overhead electrical conductor to provide an electrically conductive connection between the grounding clamp and the overhead electrical conductor;

operating a motor carried on the hot stick to rotate the adapter and the rotatable member together to actuate the grounding clamp from the clamped condition to an open condition wherein the grounding clamp and the overhead electrical conductor can be disengaged; and disengaging the overhead electrical conductor and the grounding clamp.

20. The method of claim 19 wherein the step of operating a motor further comprises stopping the rotation of the motor in response to a sensed current draw by the motor.

* * * * *